United States Patent
Soda (10) Patent No.: US 7,229,915 B2
(45) Date of Patent: Jun. 12, 2007

(54) METHOD FOR MANUFACTURING SEMICONDUCTOR DEVICE

(75) Inventor: Eiichi Soda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 223 days.

(21) Appl. No.: 11/002,198

(22) Filed: Dec. 3, 2004

(65) Prior Publication Data

US 2005/0191850 A1 Sep. 1, 2005

(30) Foreign Application Priority Data

Feb. 27, 2004 (JP) ............................. 2004-053614
Oct. 15, 2004 (JP) ............................. 2004-301494

(51) Int. Cl.
*H01L 21/4763* (2006.01)

(52) U.S. Cl. .................... 438/633; 438/637; 438/710; 438/689; 257/E21.579; 257/E21.252

(58) Field of Classification Search ............... 438/633, 438/637, 710, 689; 257/E21.579, E21.252
See application file for complete search history.

(56) References Cited

U.S. PATENT DOCUMENTS

| | | | | |
|---|---|---|---|---|
| 6,080,529 | A * | 6/2000 | Ye et al. ...................... | 430/318 |
| 6,207,583 | B1 * | 3/2001 | Dunne et al. ................. | 438/725 |
| 6,355,572 | B1 | 3/2002 | Ikegami | |
| 6,417,112 | B1 * | 7/2002 | Peyne et al. ................. | 438/754 |
| 6,458,516 | B1 * | 10/2002 | Ye et al. ...................... | 430/317 |
| 6,562,416 | B2 * | 5/2003 | Ngo et al. .................... | 427/534 |
| 6,617,232 | B2 * | 9/2003 | Kim et al. .................... | 438/597 |
| 6,617,244 | B2 * | 9/2003 | Nishizawa ................... | 438/637 |
| 6,632,746 | B2 * | 10/2003 | Kanegae et al. ............. | 438/706 |
| 6,737,350 | B1 * | 5/2004 | Akahori et al. .............. | 438/634 |
| 6,949,203 | B2 * | 9/2005 | Hsieh et al. .................. | 216/67 |
| 2002/0119677 | A1 | 8/2002 | Soda et al. | |
| 2003/0054656 | A1 | 3/2003 | Eiichi | |
| 2003/0211750 | A1 * | 11/2003 | Kim et al. .................... | 438/711 |
| 2004/0214430 | A1 * | 10/2004 | Ruelke et al. ............... | 438/687 |
| 2005/0245074 | A1 * | 11/2005 | Jiang et al. .................. | 438/637 |
| 2006/0138399 | A1 * | 6/2006 | Itano et al. ................... | 257/40 |

FOREIGN PATENT DOCUMENTS

| | | |
|---|---|---|
| JP | 2000-036484 | 2/2000 |
| JP | 2004/071856 | 3/2004 |

* cited by examiner

*Primary Examiner*—B. William Baumeister
*Assistant Examiner*—Igwe U. Anya
(74) *Attorney, Agent, or Firm*—Leydig, Voit & Mayer, Ltd.

(57) ABSTRACT

A first insulating film, a second insulating film, a third insulating film, an antireflective film, and a resist film are formed in this order on a lower-layer wiring. After dry etching the third insulating film and the second insulating film, using the resist film as a mask, the resist film and the antireflective film are removed by ashing. Thereafter, the first insulating film is dry etched, using the third insulating film as a mask, to form a wiring trench extending to the lower-layer wiring. The dry etching of the third insulating film and the second insulating film is performed using a gas containing fluorine at a pressure of 0.1 Pa to 4 Pa. Ashing is preferably performed using at least one of hydrogen and an inert gas.

20 Claims, 10 Drawing Sheets

Prior Art

METHOD FOR MANUFACTURING SEMICONDUCTOR DEVICE

BACKGROUND OF INVENTION

1. Field of the Invention

The present invention relates to a method for manufacturing a semiconductor device, and more specifically, to a method for manufacturing a semiconductor device using a insulating film having a low relative dielectric constant as an interlayer insulating film.

2. Background Art

In recent years, the speed of semiconductor devices has markedly risen, and concurrently, transmission delay due to lowered signal transmission speed caused by the parasitic capacitance between wiring resistances and wirings in multi-layer wiring portions has caused problems. Such problems tend to be more significant with increase in the wiring resistance and the parasitic capacitance due to the reduction of wiring width and wiring distance accompanying the high integration of semiconductor devices.

Heretofore, in order to prevent the signal delay due to increase in wiring resistance and parasitic capacitance, copper wirings substituting aluminum wirings have been introduced, and the use of a insulating film having a low relative dielectric constant (hereafter referred to as "low-k film") as an interlayer insulating film has been examined.

The methods for forming copper wiring using a low-k film include the Damascene method (e.g., refer to Japanese Patent Application Laid-Open No. 2000-36484). This method has been known as the technique for forming wiring without etching copper, because copper is more difficult to control the etching rate than aluminum.

Specifically, the Damascene method is a method wherein an etching-stopper film, a low-k film and a cap film are formed on a lower-layer wiring in this order, a wiring trench is formed by dry etching using a resist film as a mask, the resist film is removed by ashing, and then, a copper layer is buried in the wiring trench to form a copper wiring layer. The copper layer can be buried by forming the copper layer using a plating method so as to fill the wiring trench, and then by planarizing the surface using a CMP (chemical-mechanical polishing) method so as to leave the copper-layer only in the wiring trench.

In the above-described step of forming the wiring trench, a fluorine-containing gas is used as the etching gas. Here, in order to form the wiring trench having an ideally rectangular cross section, the pressure during etching is preferably as high as about 30 mTorr to 300 mTorr (about 4 Pa to about 40 Pa) to enhance isotropy. However, in isotropic etching, collision of active species formed by plasma applies large impact to the low-k film. Therefore, for example, when a porous MSQ (methyl silsesquioxane) film is used as the low-k film, there is a problem that methyl groups (—$CH_3$) in the vicinity of the sidewall are released by collision to form a damaged layer, and the relative dielectric constant of the film rises.

When etching is performed in the high-pressure region, fluorine derived from the etching gas is, easily incorporated in the low-k film. If the moisture incorporated in the low-k film in a plating step reacts with fluorine due to heat treatment, hydrofluoric acid (HF) is formed in the low-k film. Since the hydrofluoric acid corrodes the low-k film, voids are formed in the low-k film, and cause a problem of lowering the electrical properties and the reliability of semiconductor devices. Specifically, since the formation of voids lowers the mechanical strength of the low-k film and reduces the adhesion area between the upper-layer film and the lower-layer film, the films are easily peeled off during polishing by a CMP method.

Figure 16:
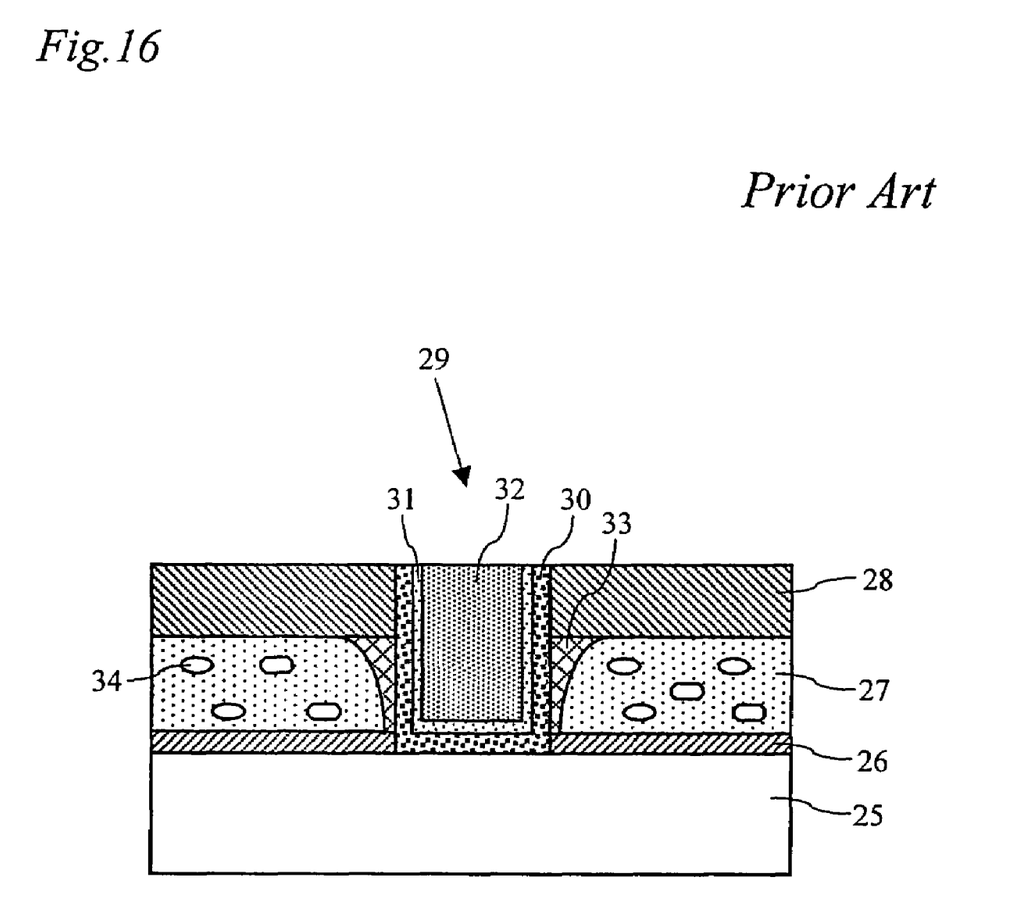
FIG. 16 is a cross-sectional view of a conventional semiconductor device.

FIG. 16 is a sectional view of a semiconductor device formed using a conventional method. In FIG. 16, a copper wiring layer 29 is formed in an etching stopper film 26, a low-k film 27, and a cap film 28 formed on a lower-layer wiring 25. Reference numerals 30, 31 and 32 denote a barrier metal film, a seed copper film, and a copper layer, respectively. On the sidewall portion of the low-k film 27, a damaged-film 33 is formed in the dry etching step. Fluorine incorporated in the low-k film 27 corrodes the low-k film 27, and a large number of voids 34 are formed.

On the other hand, to cope with the problem that the cross section of the opening becomes a Boeing shape when the low-k film is etched using a fluorocarbon-based gas, a method wherein etching is performed using a mixture gas containing $N_2$ (nitrogen) and $H_2$ (hydrogen) under a low pressure has been proposed (e.g., Patent Document 1).

However, a fluorine-containing gas is not used as the etching gas in the conventional method. The problems of the damage of the low-k film and the voids formed in the low-k film due to dry etching are not solved in the conventional method.

SUMMARY OF THE INVENTION

The object of the present invention is to solve these problems. Specifically, the object of the present invention is to provide a method for manufacturing a semiconductor device that performs dry etching using a fluorine-containing gas, and can suppress the formation of a damaged layer on the sidewall of the wiring trench and the formation of voids in the low-k film.

According to one aspect of the present invention, in a method for manufacturing a semiconductor device having a multi-layer wiring structure, a first insulating film is formed on a lower-layer wiring on a semiconductor substrate. A second insulating film having a large etching selection ratio to the first insulating film, and having a relative dielectric constant of 3.0 or below, is formed on the first insulating film. A third insulating film as a cap film is formed on the second insulating film. A first resist film having a predetermined pattern is formed on the third insulating film. First dry etching is performed to the third insulating film and the second insulating film using the first resist film as a mask, to form an opening extending to the first insulating film. The first resist film is removed by first ashing. Second dry etching is performed to the first insulating film using the third insulating film as a mask, to form a wiring trench extending to the lower-layer wiring. A copper layer is formed so as to bury the wiring trench. The surface is planarized using a CMP method so as to leave the copper layer only in the wiring trench, to form a trench wiring electrically connected to the lower wiring. The first dry etching is performed using a fluorine-containing gas under a pressure of 0.1 Pa to 4 Pa.

According to another aspect of the present invention, in a method for manufacturing a semiconductor device having a multi-layer wiring structure, a first insulating film is formed on a lower-layer wiring on a semiconductor substrate. A second insulating film having a large etching selection ratio to the first insulating film, and having a relative dielectric constant of 3.0 or below, is formed on the first insulating film. A third insulating film as a cap film is formed on the second insulating film. A first antireflective film is formed on the third insulating film. A first resist film having a predetermined pattern is formed on the first antireflective film. First dry etching is performed to the first antireflective film, the third insulating film and the second insulating film using the first resist film as a mask, to form an opening extending to the first insulating film. The first resist film and the first antireflective film are removed by first ashing. Second dry etching is performed to the first insulating film using the third insulating film as a mask, to form a wiring trench extending to the lower-layer wiring. A copper layer is formed so as to bury the wiring trench. The surface is planarized using a CMP method so as to leave the copper layer only in the wiring trench, to form a trench wiring electrically connected to the lower-layer wiring. The first dry etching is performed using a gas containing fluorine at a pressure of 0.1 Pa to 4 Pa.

Other objects and advantages of the present invention will be apparent from the following description.

DETAILED DESCRIPTION OF THE PREFERRED EMBODIMENTS

The embodiment of the present invention will be described in detail referring to the drawings.

FIGS. 1 to 12 are sectional views illustrating the method for manufacturing a semiconductor device according to the embodiment of the present invention. In the drawings, parts denoted with the same reference numerals are the same parts.

Figure 1:
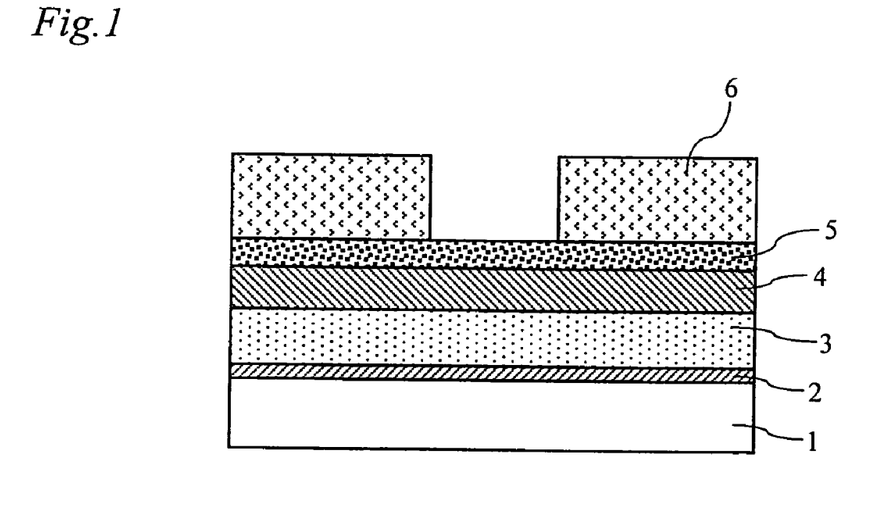
FIG. 1 is a cross-sectional view illustrating a method for manufacturing a semiconductor device according to the present invention.

First, a semiconductor substrate on which a lower-layer wiring 1 has been formed is prepared (FIG. 1). As the semiconductor substrate, for example, a silicon substrate can be used. For simplification, the structure of the lower-layer wiring 1 is not shown.

Next, on the lower-layer wiring 1, a first insulating film 2 and a second insulating film 3 are formed in this order (FIG. 1). Here, the first insulating film 2 and the second insulating film 3 can be formed using a plasma CVD method or a spin-coating method.

The first insulating film 2 is an etching stopper film, and is formed using a material having a large etching selection ratio to the second insulating film 3. For example, a silicon nitride (SiN) film, a silicon carbide (SiC) film, or a silicon carbonitride (SiCN) film can be used. Since these materials have low copper diffusibility, the use of these materials as the first insulating film 2 can make the first insulating film 2 function also as a diffusion preventing film.

The second insulating film 3 is an interlayer insulating film and uses a film having a relative dielectric constant lower than the relative dielectric constant of a silicon dioxide ($SiO_2$) film. Specifically, a insulating film having a low relative dielectric constant (low-k film) having a relative dielectric constant of 3.0 or below, preferably 2.5 or below, is used. For example, materials such as organo polysiloxanes, which are polysiloxanes having organic functional groups, and a porous organic polymer containing aromatic groups can be used. Of these materials, organo polysiloxanes, such as alkyl silsesquioxane and alkyl siloxane hydride are preferably used for the excellent dielectric properties and workability thereof. The examples include materials that have siloxane bonds having methyl groups, such as methyl silsesquioxane (MSQ) and methylated hydrogen silsesquioxane (MHSQ) as the main chain-forming bonds. Of these materials, MSQ represented by Formula (1) that excels in dielectric properties and workability is preferably used, and porous MSQ having lower permittivity is more preferably used.

[Formula 1]

(1)

The second insulating film 3 can be formed by a plasma CVD method using, for example, a mixture gas of alkyl silane gas and an oxidizing gas as the material gas. Here, the examples of the alkyl silane gas include monomethyl silane, dimethyl silane, trimethyl silane, and tetramethyl silane. Of these silanes, trimethyl silane is most preferably used. A single alkyl silane can be used, or a combination of two or more silanes can also be used. On the other hand, as the oxidizing gas, the gas having an oxidizing function to alkyl silanes, and containing oxygen atoms in the molecule are used. For example, one or more gas selected from a group consisting of nitrogen monoxide (NO) gas, nitrogen dioxide ($NO_2$) gas, carbon monoxide (CO) gas, carbon dioxide ($CO_2$) gas, and oxygen ($O_2$) gas can be used. Of these gases, NO gas or $NO_2$ gas, which has a moderate oxidizing ability is preferably used.

The second insulating film 3 can also be formed using a spin-coating method. For example, after drop-coating the composition of the second insulating film on a wafer rotating at a predetermined rotation speed, a multi-stage heat treatment, and drying and curing are performed to form the second insulating film 3. In this case, an insulating film having a low relative dielectric constant can be formed by changing the conditions of the heat treatment to enhance the porosity of the formed film.

After forming the second insulating film 3, a third insulating film 4 is further formed thereon (FIG. 1). The third insulating film 4 is a cap film, and plays the role to prevent the plasma damage of the second insulating film 3 due to the ashing of the resist film, as well as to prevent the elevation of the relative dielectric constant of the second insulating film 3 due to moisture absorption, when the step of patterning the resist film using a photolithography method is reworked. Furthermore, when the polishing selection ratio of the third insulating film 4 to the second insulating film 3 is large, the third insulating film 4 functions as a CMP stopper in the step of forming the copper wiring layer.

As the third insulating film 4, a silicon dioxide ($SiO_2$) film, a silicon carbide (SiC) film, a silicon carbonitride (SiCN) film, or a silicon nitride (SiN) film can be used. A laminated film formed by laminating two or more of these films can also be used as the third insulating film 4.

Next an antireflective film 5 as a first antireflective film is formed on the third insulating film 4. Thereafter, a resist film 6 as a first resist film having a predetermined pattern is formed on the antireflective film 5 (FIG. 1). Specifically, a photoresist (not shown) is applied onto the entire surface of the antireflective film 5, exposed through a mask having a predetermined pattern, and developed. Thereby, the photoresist can be patterned to form the resist film 6.

The antireflective film 5 plays a role to eliminate the reflection of exposing light at the boundary between the photoresist and the antireflective film 5 by absorbing the exposing light having passed through the photoresist when the photoresist is patterned. As the antireflective film 5, an organic-matter-based film can be used, and can be formed by a spin-coating method or the like. In the present invention, the antireflective film 5 is not necessarily required.

The type of the resist film 6 is adequately selected depending on the size of the formed pattern. For example, when the pattern size is 180 to 250 nm, a resist corresponding to the exposing apparatus using a krypton fluoride (KrF) excimer layer (wavelength: 248 nm) (KrF resist) as a light source can be used. When the pattern size is 100 to 130 nm, a resist corresponding to the exposing apparatus using an argon fluoride (ArF) excimer layer (wavelength: 193 nm) (ArF resist) as a light source can be used. Furthermore, when the pattern size is 50 to 70 nm, a resist corresponding to the exposing apparatus using a fluorine ($F_2$) layer (wavelength: 157 nm) as a light source ($F_2$ resist) can be used.

Figure 2:
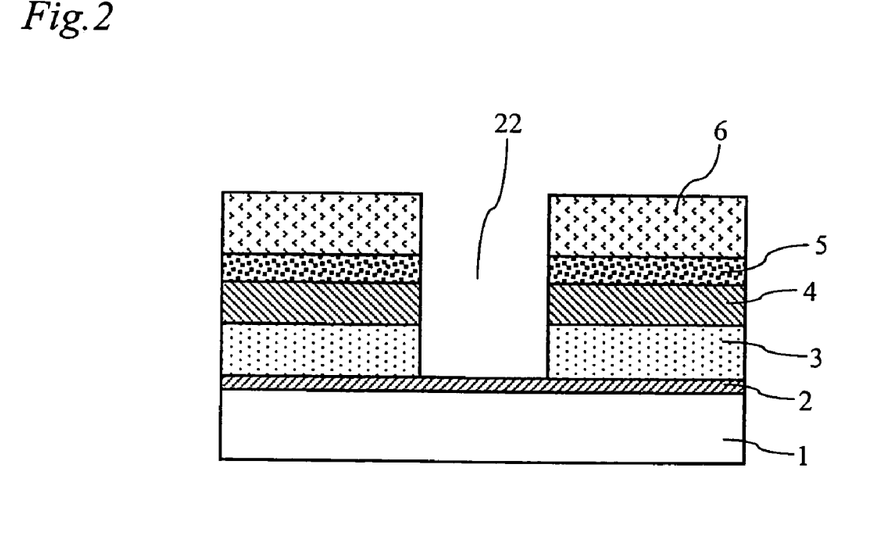
FIG. 2 is a cross-sectional view illustrating a method for manufacturing a semiconductor device according to the present invention.

Next, using the resist film 6 as a mask and a fluorine-containing gas, the antireflective film 5, the third insulating film 4 and the second insulating film 3 are subjected to dry etching (first dry etching). This etching is automatically terminated when the first insulating film 2 is reached, and an opening 22 extending to the first insulating film 2 is formed (FIG. 2).

The first dry etching step can be carried out using a fluorocarbon-based gas to which hydrogen ($H_2$) gas is added. The first dry etching step can also be carried out using a fluorocarbon-based gas to which one or more inert gas, such as nitrogen ($N_2$), helium (He), neon (Ne) and argon (Ar), is added. Furthermore, the first dry etching step can also be carried out using a fluorocarbon-based gas to which $H_2$ gas and one or more inert gas is added. The examples of fluorocarbon-based gases include tetrafluoromethane ($CF_4$), octafluorocyclobutane ($C_4F_8$), octafluorocyclopentene ($C_5F_8$) hexafluoroethane ($C_2F_6$), hexafluorobutadiene ($C_4F_6$), and hexafluorobenzene ($C_6F_6$).

The present invention is characterized in that the pressure in the first dry etching is lower than in conventional methods. Here, although lower pressures are preferred, excessively low pressures makes it difficult to stably generate plasma. Therefore, in the present invention, the pressure of the etching gas is preferably 0.1 Pa to 4 Pa, more preferably 0.8 Pa to 3.3 Pa. By thus lowering the pressure, the incorporation of fluorine in the second insulating film 3 can be suppressed. The damage to the sidewall of the second insulating film 3 can be reduced, and the rise in the relative dielectric constant of the second insulating film 3 can be suppressed. Furthermore, the cross-sectional shape of the opening 22 can become a preferable rectangular shape, not a Boeing shape.

Figure 13A:
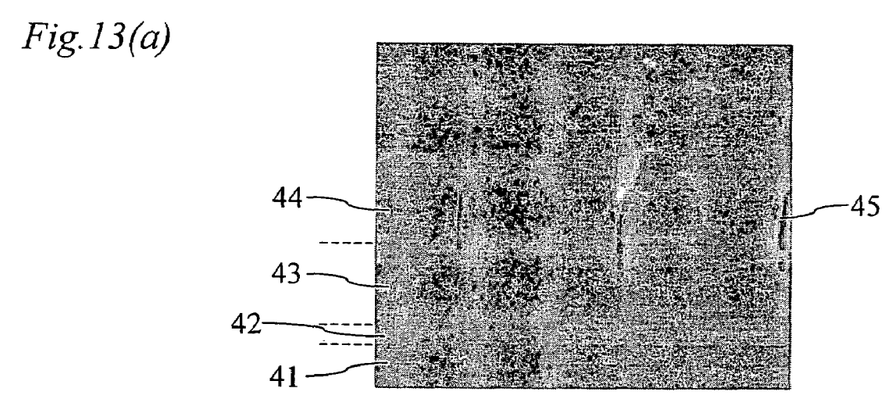
FIGS. 13(a) to 13(c) are SEM photographs of a semiconductor device after the first dry etching.
Figure 13B:
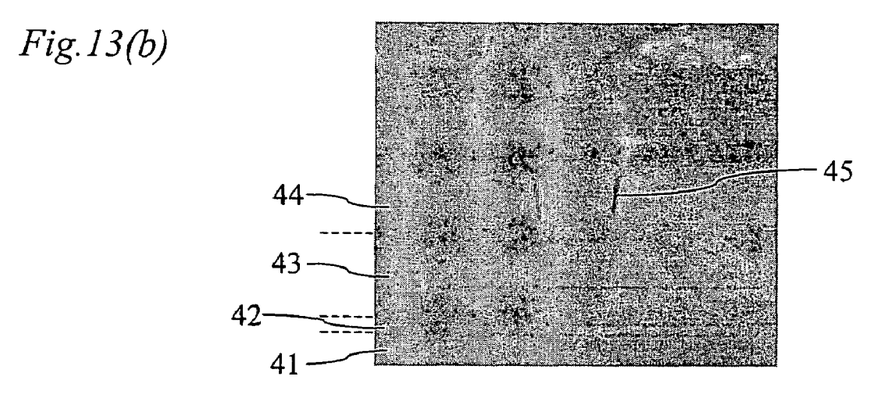
Figure 13C:
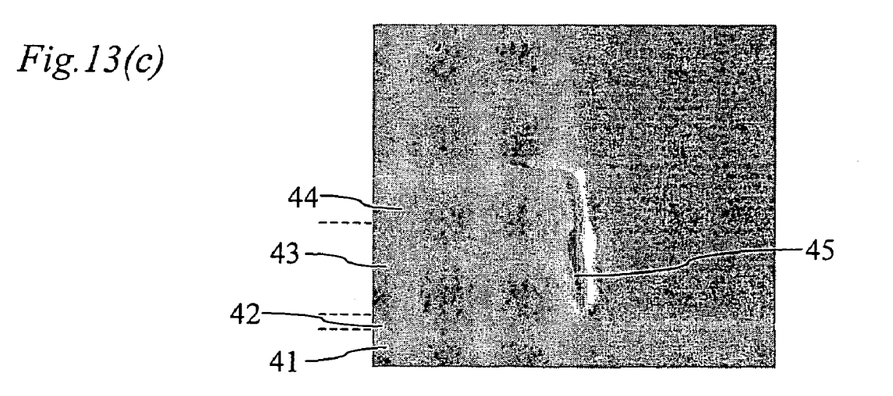

FIG. 13 is SEM (scanning electron microscope) photographs of a semiconductor device, treated with a hydrofluoric acid (HF) solution after the first dry etching. In this example, an SiC film 42 as the first insulating film, a porous MSQ film (relative dielectric constant: 2.3) 43 as the second insulating film, and an $SiO_2$ film 44 as the third insulating film are laminated on the silicon substrate 41 in this order. The first dry etching is performed under the conditions of the flow rate of the $CF_4$ gas of 140 sccm, the flow rate of the Ar gas of 1000 sccm, the flow rate of the $N_2$ gas of 50 sccm, the pressure of 3.3 Pa (25 mT), the source power of 1200 W, and the bias power of 700 W.

FIG. 13 shows three examples ((a) to (c)) of different pattern line width and different distance between patterns. Although the distance between patterns in FIGS. 13(a) and 13(b) is substantially the same, the pattern line width in FIG. 13(b) is larger than that in FIG. 13(a). Both the distance between patterns and the pattern line width in FIG. 13(c), is larger than those in FIG. 13(a).

Figure 14A:
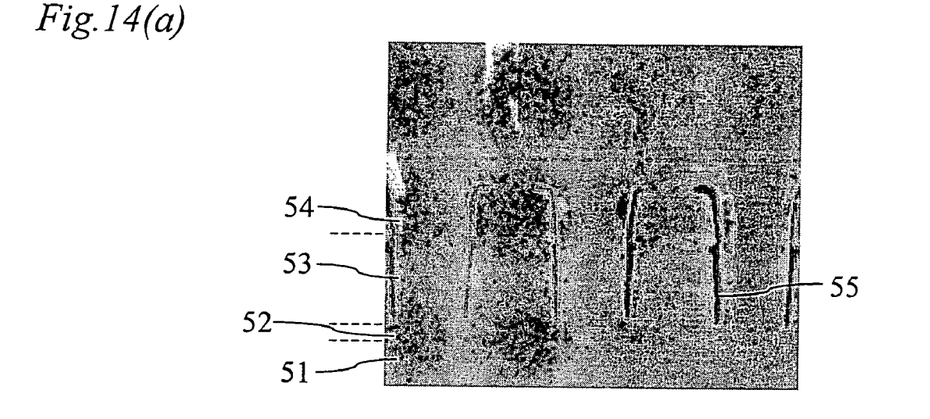
FIGS. 14(a) to 14(c) are SEM photographs of a semiconductor device according to comparative example.
Figure 14B:
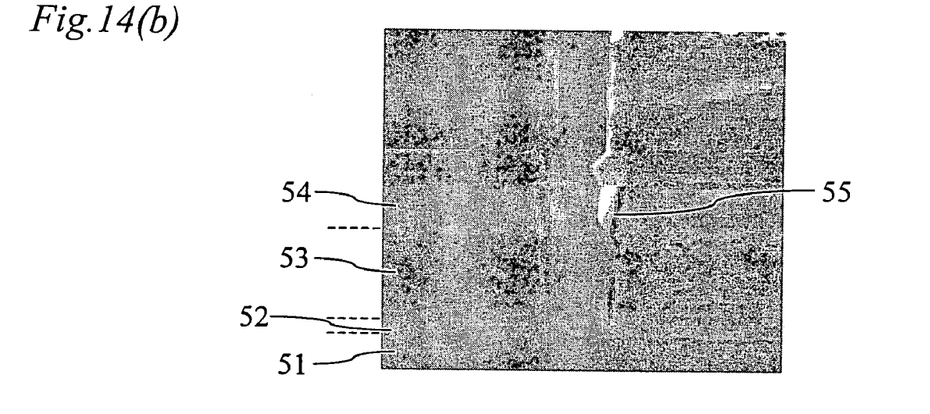
Figure 14C:
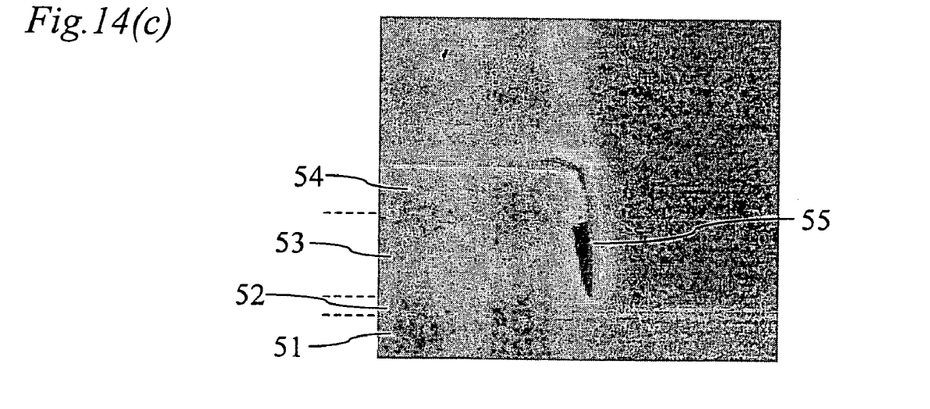

FIG. 14 shows comparative examples of the examples shown in FIG. 13, and is SEM photographs of a semiconductor device, treated with an HF solution after the first dry etching under a higher pressure than the example of FIG. 13. As in FIG. 13, an SiC film 52 as the first insulating film, a porous MSQ film (relative dielectric constant: 2.3) 53 as the second insulating film, and an $SiO_2$ film 54 as the third insulating film are laminated on the silicon substrate 51 in this order. The first dry etching is performed under the conditions of the flow rate of the $C_4F_8$ gas of 10 sccm, the flow rate of the Ar gas of 1000 sccm, the flow rate of the $N_2$ gas of 140 sccm, the pressure of 10 Pa (75 mT), the source power of 2400 W, and the bias power of 3300 W.

Similar to FIG. 13, FIG. 14 shows three examples ((a) to (c)) of different pattern line width and different distance between patterns. Although the distance between patterns in FIGS. 14(a) and 14(b) is substantially the same, the pattern line width in FIG. 14(b) is larger than that in FIG. 14(a). Both the distance between patterns and the pattern line width in FIG. 14(c) is larger than those in FIG. 14(a).

As seen from FIGS. 14(a) to 14(c), when the first dry etching is performed under a high pressure, voids 55 are formed as a result of dissolution of the damaged layers formed on the sidewall of the porous MSQ film 53 and the $SiO_2$ film 54 in the HF solution. On the other hand, in the example of FIGS. 13(a) to 13(c), the region where voids 45 are formed is significantly smaller than the regions shown in FIGS. 14(a) to 14(c). Therefore, by performing the first dry etching under a low pressure, damage to the porous MSQ film can be significantly reduced, and the formation of the damaged layer on the sidewall can be suppressed.

Figure 3:
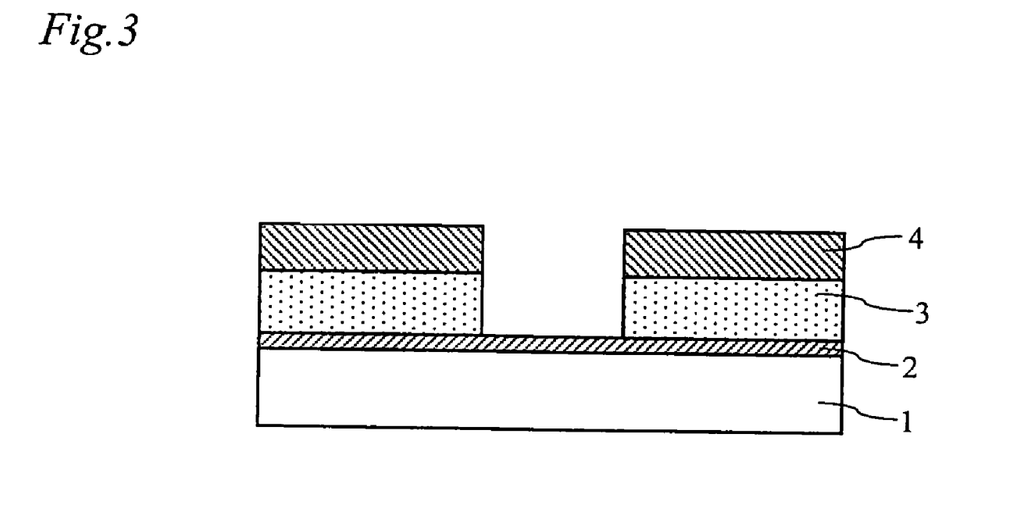
FIG. 3 is a cross-sectional view illustrating a method for manufacturing a semiconductor device according to the present invention.

Next, the resist film 6 and the antireflective film 5 no longer required are removed using ashing (first ashing) (FIG. 3). It is preferable that ashing is performed using a gas containing no $O_2$ (oxygen) in order to reduce a damage to the second insulating film 3. Specifically, ashing can be performed using $H_2$ gas; using one or more inert gas, such as $N_2$, He, Ne and Ar; or using $H_2$ gas to which one or more inert gas is mixed.

Figure 4:
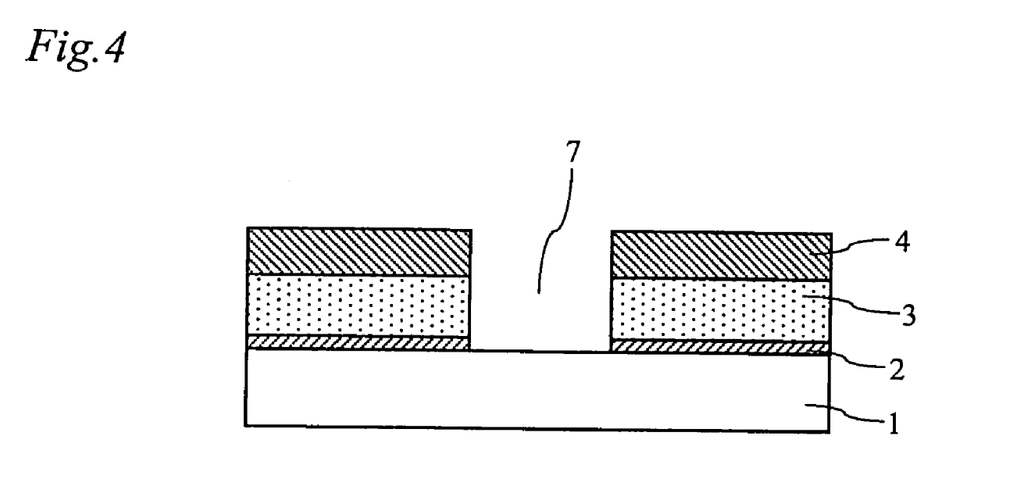
FIG. 4 is a cross-sectional view illustrating a method for manufacturing a semiconductor device according to the present invention.

Next, the first insulating film 2 is subjected to dry etching (second dry etching) using the third insulating film 4 as a mask (FIG. 4). At this time, over etching is performed so that the first insulating film 2 does not remain and the lower-layer wiring 1 is completely exposed on the surface.

The second dry etching can also be preformed using a gas identical to the gas used in the first dry etching. In the same manner as in the first dry etching, the second dry etching is also preferably performed under conditions to reduce damage to the second insulating film 3, and to suppress the incorporation of fluorine into the second insulating film 3. Specifically, the second dry etching is preferably performed under a pressure lower than the pressure used in the conventional methods.

The gas used in the second dry etching (second etching gas) can be a gas having the same composition as the gas used in the first dry etching (first etching gas), or can be a gas having a different composition. However, if a gas having the same composition as the first etching gas is used, the etching conditions, such as the temperature, pressure, and gas flow rate, must be different from the etching conditions for the first dry etching within the range to reduce damage to the second insulating film 3 and the diffusion of fluorine.

For example, when an SiC film is used as the first insulating film 2, a porous MSQ film is used as the second insulating film 3, and an $SiO_2$ film is used as the third insulating film 4, the first dry etching can be performed using a mixture gas consisting of $C_4F_8$ (octafluorocyclobutane), $N_2$ (nitrogen) and Ar (argon), or a mixture gas consisting of $CF_4$ (tetrafluoromethane), $N_2$ and Ar. The second dry etching can be performed to the SiC film using a mixture gas consisting of $CHF_3$ (trifluoromethane), $N_2$ (nitrogen) and Ar (argon), or a mixture gas consisting of $CF_4$ (tetrafluoromethane), $N_2$ and Ar. On the other hand, if an ArF resist is used for the resist film 6, ashing by high-temperature plasma using a mixture gas of $H_2$ (hydrogen) and He (helium), or ashing by low-temperature plasma using a mixture gas of $H_2$ and $N_2$ (nitrogen) can be performed.

After the completion of the second dry etching, a cleaning treatment is performed on the surface of the semiconductor substrate to remove the residual resist and the like. Through the above steps, as FIG. 4 shows, a wiring trench 7 extending to the lower-layer wiring 1 is formed.

Figure 5:
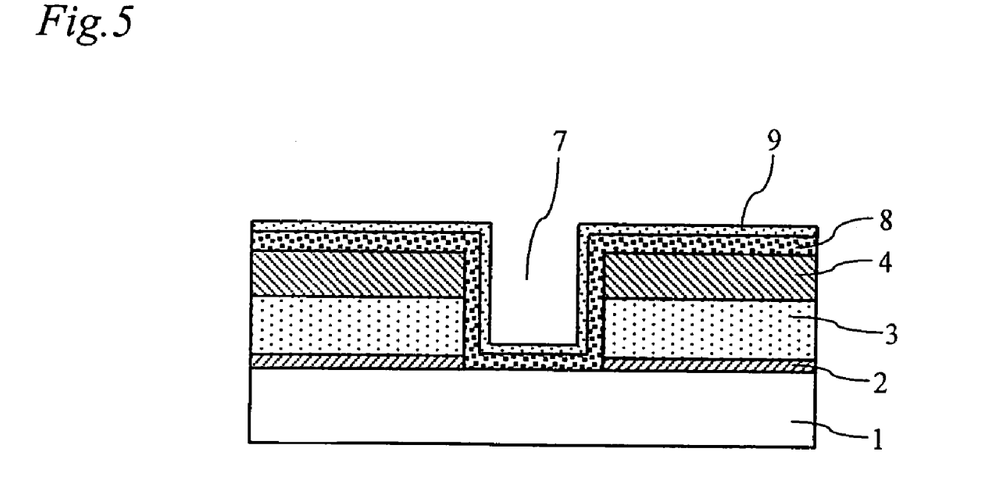
FIG. 5 is a cross-sectional view illustrating a method for manufacturing a semiconductor device according to the present invention.

Next, after forming a barrier metal film 8 on the entire surface including the wiring trench 7, a seed copper (Cu) film 9, is formed (FIG. 5). These films can be formed using a sputtering method.

The barrier metal film 8 can be formed using a tantalum (Ta) film, a tantalum nitride (TaN) film, a tungsten (W) film, a tungsten nitride (WN) film, a titanium (Ti) film or a titanium nitride (TiN) film.

Figure 6:
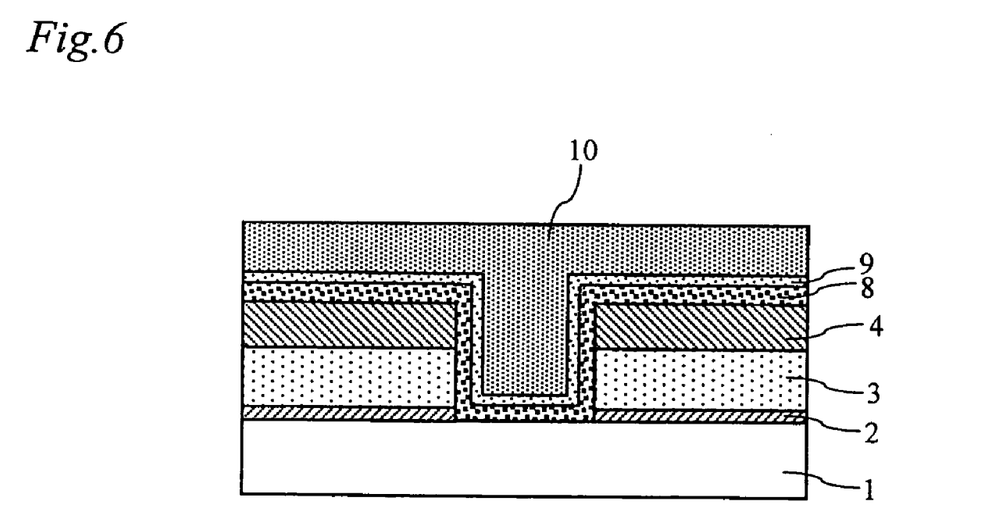
FIG. 6 is a cross-sectional view illustrating a method for manufacturing a semiconductor device according to the present invention.

After the seed copper film 9 is formed, a copper layer 10 is formed using a plating method (FIG. 6). Here, although the copper layer 10 may be a layer consisting only of copper, it may be a layer consisting of an alloy of copper with other metals. Specifically, an alloy containing 80% or more, preferably 90% by weight of copper, and other metals, such as magnesium (Mg), scandium (Sc), zirconium (Zr), hafnium (Hf), niobium (Nb), tantalum (Ta), chromium (Cr) and molybdenum (Mo), can be used. If such copper alloys are used for the wiring layer, the electrical reliability of the semiconductor device can be improved.

After the copper layer 10 is formed, heat treatment is performed at a temperature of about 350 to grow copper grains, and to evenly fill the wiring trench 7 with copper. Here, through the above-described cleaning and plating steps, moisture permeates into the second insulating film 3. According to the present invention, however, since the quantity of fluorine incorporated in the second insulating film 3 can be reduced in the dry etching step, less hydrofluoric acid (HF), is formed in the second insulating film 3 even if heat treatment is performed.

After the heat treatment is completed, the surface is planarized using a CMP method, and the copper layer 10, the seed copper layer 9, and the barrier metal film 8 are removed except those in the wiring trench 7. At this time, when the third insulating film 4 functions as a CMP stopper, polishing is automatically stopped when the third insulating film 4 is exposed. According to the present invention, since the formation of voids in the second insulating film 3 can be suppressed, no peeling or the like occurs during the polishing step using a CMP method at the boundary between the second insulating film 3 and the first insulating film 2 and/or the boundary between the second insulating film 3 and the third insulating film 4.

Figure 7:
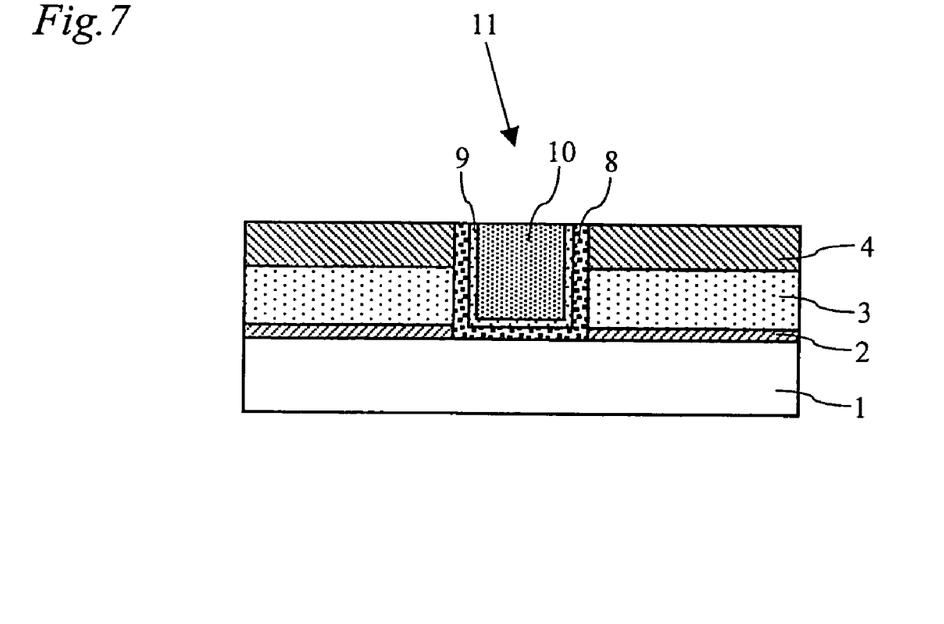
FIG. 7 is a cross-sectional view illustrating a method for manufacturing a semiconductor device according to the present invention.

Through the above steps, a trench wiring 11 electrically connected to the lower-layer wiring 1 can be formed (FIG. 7).

Figure 15:
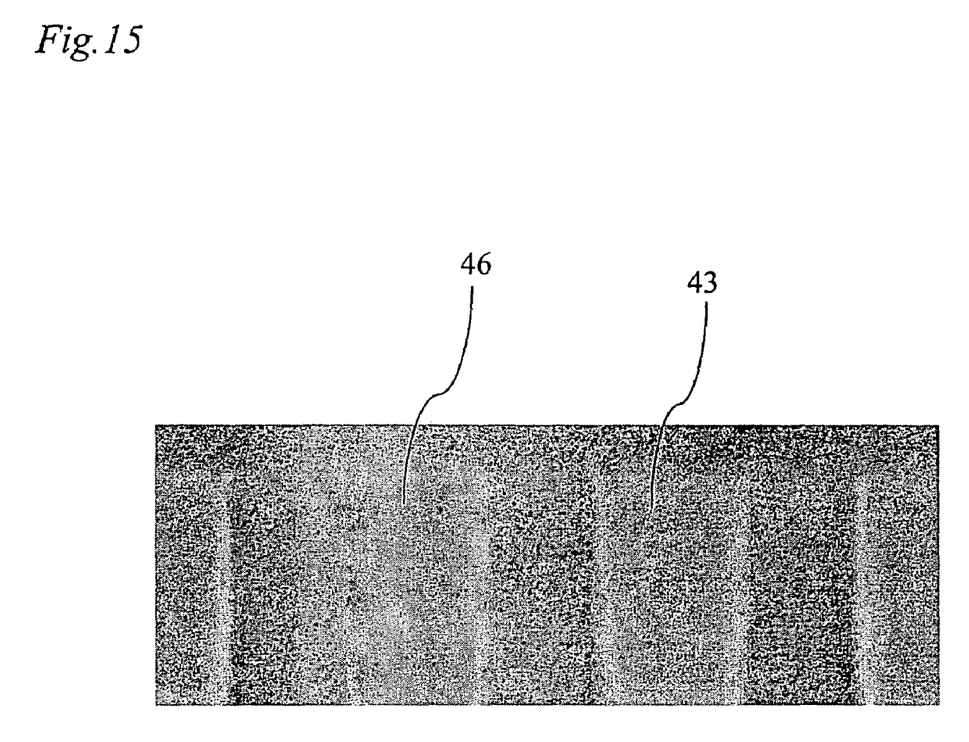
FIG. 15 is an SEM photograph of a semiconductor device after heat treatment.

FIG. 15 is an SEM (scanning electron microscope) photograph of a semiconductor device after heat treatment is performed at 350° C. after forming a copper layer. In this example, first dry etching is performed under the conditions of the flow rate of the $CF_4$ gas of 140 sccm, the flow rate of the Ar gas of 1,000 sccm, the flow rate of the $N_2$ gas of 50 sccm, the pressure of 3.3 Pa (25 mT), the source power of 1200 W, and the bias power of 700 W, and then, ashing is performed using a mixture gas of $H_2$ gas and He gas. The first insulating film, the second insulating film, and the third insulating film are the same as those shown in FIG. 13. In FIG. 15, the reference numeral 46 denotes a copper layer.

As seen from FIG. 15, according to the present invention, no voids are formed in the porous MSQ film 43. This is because the quantity of fluorine incorporated in the porous MSQ film 43 during the dry etching step, and only little hydrofluoric acid (HF) is formed in the porous MSQ film 43 even if heat treatment is performed. In other words, since the porous MSQ film 43 is riot corroded by hydrofluoric acid, the formation of voids in the porous MSQ film 43 can be prevented.

Next, the steps of forming a via plug electrically connected to the trench wiring 11 will be described.

Figure 8:
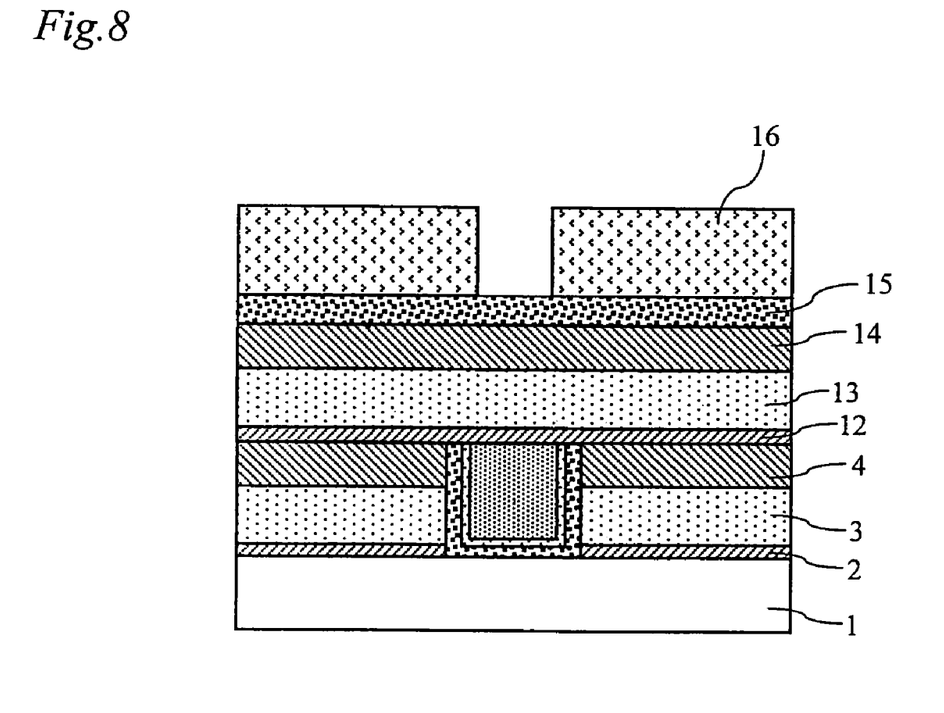
FIG. 8 is a cross-sectional view illustrating a method for manufacturing a semiconductor device according to the present invention.

First, a fourth insulating film 12 is formed on the trench wiring 11 (FIG. 8). The fourth insulating film 12 is an etching stopper film similar to the first insulating film 2 as well as a diffusion preventing film, and plays a role to prevent the diffusion of copper into the fifth insulating film 13 formed in the subsequent step. As the fourth insulating film 12, for example, a silicon carbide (SiC) film, a silicon carbonitride (SiCN) film, or a silicon nitride (SiN) film can be used, and these can be formed using a plasma CVD method or the like.

Next, a fifth insulating film 13 and a sixth insulating film 14 are formed on the fourth insulating film 12. On the sixth insulating film 14, an antireflective film 15 is formed as a second resist film, and then, on the antireflective film 15, a resist film 16 is formed as a second resist film (FIG. 8). Here, as the antireflective film 15 and the resist film 16, the films similar to the antireflective film 5 and the resist film 6 used in the formation of the wiring trench 11 can be used.

The fifth insulating film 13 is an insulating film and uses a film similar to the second insulating film 3 can be used. Specifically, a insulating film having a low relative dielectric constant (low-k film) having a large etching selection ratio to the fourth insulating film 12, and a relative dielectric constant of 3.0 or below, preferably 2.5 or below, is used as the fifth insulating film 13. For example, materials such as organo polysiloxanes, which are polysiloxanes having organic functional groups, and a porous organic resin containing aromatic groups can be used. Of these materials, organo polysiloxanes, such as alkyl silsesquioxane and alkyl siloxane hydride are preferably used for the excellent dielectric properties and workability thereof. The examples include materials that have siloxane bonds having methyl groups, such as methyl silsesquioxane (MSQ) and methylated hydrogen silsesquioxane (MHSQ) as the main chain-forming bonds. Of these materials, MSQ represented by Formula (1) that excels in dielectric properties and workability is preferably used, and porous MSQ having lower permittivity is more preferably used.

The sixth insulating film 14 is a cap film, and a film similar to the third insulating film 4 can be used as the sixth insulating film 16.

Figure 9:
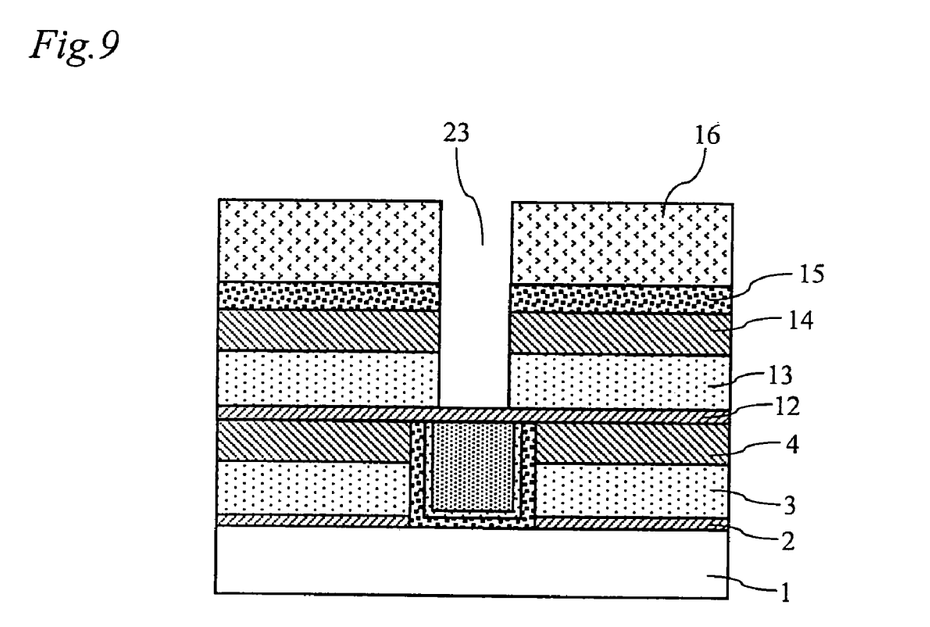
FIG. 9 is a cross-sectional view illustrating a method for manufacturing a semiconductor device according to the present invention.
Figure 10:
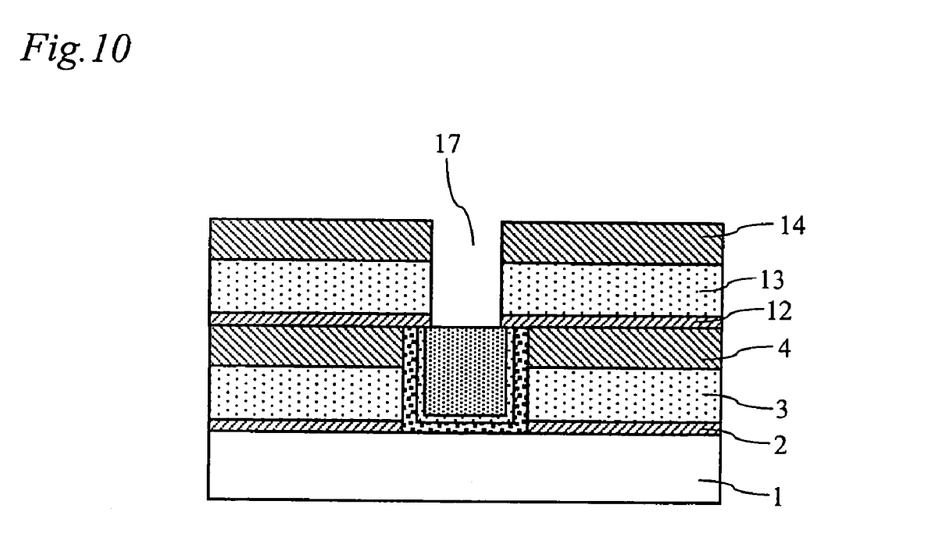
FIG. 10 is a cross-sectional view illustrating a method for manufacturing a semiconductor device according to the present invention.

Next, using the resist film 16 as a mask, the antireflective film 15, the sixth insulating film 14 and the fifth insulating film 13 are subjected to dry etching (third dry etching). Thereby, an opening 23 extending to the fourth insulating film 12 is formed (FIG. 9). Thereafter, the resist film 16 and the antireflective film 15 no longer required are removed using ashing (second ashing), and then, the fourth insulating film 12 is subjected to dry etching (fourth dry etching) using the sixth insulating film 14 as a mask. Thereby, a via hole 17 extending to the trench wiring 11 can be formed (FIG. 10).

The present invention is characterized in that the pressure in the third dry etching is lower than in conventional methods, as in the formation of the wiring trench 11. Here, although lower pressures are preferred, excessively low pressures makes it difficult to stably generate plasma. Therefore, in the present invention, the pressure of the etching gas is preferably 0.1 Pa to 4 Pa, more preferably 0.8 Pa to 3.3 Pa. By thus lowering the pressure, the incorporation of fluorine in the fifth insulating film 13 can be suppressed. The damage to the sidewall of the fifth insulating film 13 can be reduced, and the rise in the relative dielectric constant of the fifth insulating film 13 can be suppressed. Furthermore, the cross-sectional shape of the opening 17 can become a preferable rectangular shape, not a Boeing shape.

As in the third dry etching step, the fourth dry etching step is preferably performed under the conditions to reduce damage to the fifth insulating film 13, and suppress the incorporation of fluorine in the fifth insulating film 13.

The third dry etching step can be carried out using a fluorocarbon-based gas to which hydrogen ($H_2$) gas, or one or more inert gas, such as nitrogen ($N_2$), helium (He), neon (Ne) and argon (Ar), is added. Furthermore, the third dry etching step can also be carried out using a fluorocarbon-based gas to which $H_2$ gas and one or more inert gas is added. The examples of fluorocarbon-based gases include tetrafluoromethane ($CF_4$) octafluorocyclobutane ($C_4F_8$), octafluorocyclopentene ($C_5F_8$), hexafluoroethane ($C_2F_6$), hexafluorobutadiene ($C_4F_6$), and hexafluorobenzene ($C_6F_6$).

The gas used in the fourth dry etching (fourth etching gas) can be a gas having the same composition as the gas used in the third dry etching (third etching gas), or can be a gas having a different composition. However, if a gas having the same composition as the first etching gas is used, the etching conditions, such as the temperature, pressure, and gas flow rate, must be different from the etching conditions for the third dry etching within the range to reduce damage to the fifth insulating film 13 and the diffusion of fluorine.

In order to reduce damage to the fifth insulating film 13, it is preferable that the second ashing is performed using a gas containing no $O_2$ (oxygen). For example, the second etching can be performed using $H_2$ (hydrogen) gas; using one or more inert gas, such as $N_2$ (nitrogen), He (helium), Ne (neon) and Ar (argon). Furthermore, the second etching can be performed using $H_2$ gas to which one or more inert gas is mixed.

For example, when an SiC film is used as the fourth insulating film 12, a porous MSQ film is used as the fifth insulating film 13, and an $SiO_2$ film is used as the sixth insulating film 14, the third dry etching can be performed using a mixture gas consisting of $C_4F_8$(octafluorocyclobutane), $N_2$ (nitrogen) and Ar (argon), or a mixture gas consisting of $CF_4$ (tetrafluoromethane), $N_2$ and Ar. The fourth dry etching can be performed to the SiC film using a mixture gas consisting of $CHF_3$ (trifluoromethane), $N_2$ (nitrogen) and Ar (argon), or a mixture gas consisting of $CF_4$ (tetrafluoromethane), $N_2$ and Ar. On the other hand, if an ArF resist is used for the resist film 16, ashing by high-temperature plasma using a mixture gas of $H_2$ and He (helium), or ashing by low-temperature plasma using a mixture gas of $H_2$ and $N_2$ (nitrogen) can be performed.

After the formation of the via hole 17, a cleaning treatment is performed on the surface of the semiconductor substrate to remove the residual resist and the like.

Figure 11:
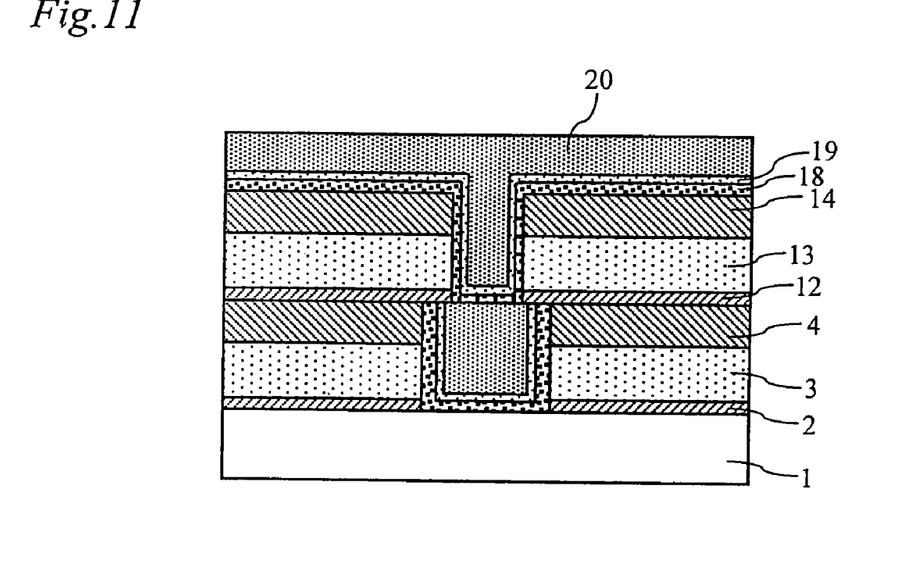
FIG. 11 is a cross-sectional view illustrating a method for manufacturing a semiconductor-device according to the present invention.

Next, in the same manner as in the formation of the trench wiring 11, a barrier metal film 18 and a seed copper (Cu) film 19 are formed on the entire surface including the via hole 17, and then, a copper layer 20 is formed using a plating method (FIG. 11). Thereafter, heat treatment is performed to grow copper grains, and to evenly fill the via hole 17 with copper. Here, through the above-described cleaning and plating steps, moisture permeates into the fifth insulating film 13. According to the present invention, however, since the quantity of fluorine incorporated in the fifth insulating film 13 can be reduced in the dry etching step, less hydrofluoric acid (HF) is formed in the fifth insulating film 13 even if heat treatment is performed.

After the heat treatment is completed, the surface is planarized using a CMP method, and the copper layer 20, the seed copper layer 19, and the barrier metal film 18 are removed except those in the via hole 17. At this time, when the sixth insulating film 14 functions as a CMP stopper, polishing is automatically stopped when the sixth insulating film 14 is exposed. According to the present invention, since the formation of voids in the fifth insulating film 13 can be suppressed, no peeling or the like occurs during the polishing step using a CMP method at the boundary between the fifth insulating film 13 and the fourth insulating film 12 and/or the boundary between the fifth insulating film 13 and the sixth insulating film 14.

Figure 12:
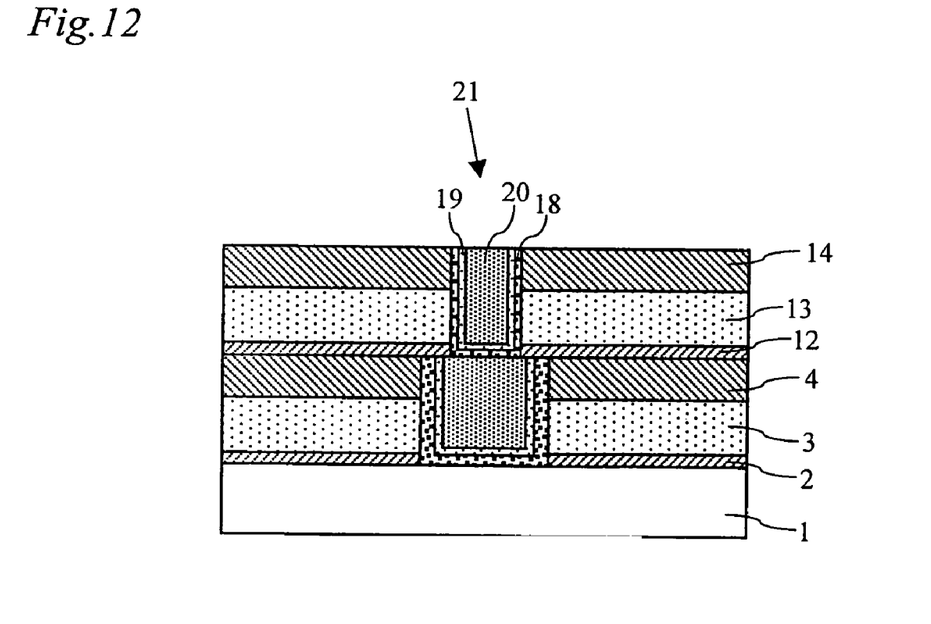
FIG. 12 is a cross-sectional view illustrating a method for manufacturing a semiconductor device according to the present invention.

Through the above steps, a via plug 21 electrically connected to the trench wiring 11 can be formed (FIG. 12).

By repeating the above-described steps of forming the trench wiring and the via plug, a multi-layer copper wiring structure without the peeling of the copper layer can be obtained. Therefore, according to the present invention, a semiconductor device of high reliability can be manufactured.

The etching apparatus used in the embodiment may be of either a dual-frequency RIE (reactive ion etching) type, or an ICP (inductively coupled plasma) type. The ashing apparatus may be a down-flow-type surface wave plasma asher or an ICP-type plasma asher. The above-described etching apparatus can also be used as an ashing apparatus.

In this embodiment, although an example of the single Damascene process is described, the present invention is not limited thereto. The present invention can be equally applied to the dry etching process and the ashing process in the dual Damascene process.

The features and advantages of the present invention may be summarized as follows.

According to the present invention, since dry etching of the second insulating film, which is a low-k film, is performed under a pressure of 0.1 to 4 Pa, the damage to the second insulating film can be reduced, and the formation of the damaged layer on the sidewall of the wiring trench can be suppressed. In addition, since the incorporation of fluorine in the second insulating film can be suppressed, the formation of voids in the second insulating film can be prevented.

Obviously many modifications and variations of the present invention are possible in the light of the above teachings. It is therefore to be understood that within the scope of the appended claims the invention may be practiced otherwise than as specifically described.

The entire disclosure of Japanese Patent Applications No. 2004-053614, filed on Feb. 27, 2004 and No. 2004-301494, filed on Oct. 15, 2004, including specifications, claims, drawings and summaries, on which the Convention priority of the present application is based, are incorporated herein by reference in their entirety.

What is claimed is:

1. A method for manufacturing a semiconductor device having a multi-layer wiring structure, comprising:
    forming a first insulating film on a lower-layer wiring that is on a semiconductor substrate;
    forming a second insulating film having a large etching selection ratio relative to said first insulating film, and having a relative dielectric constant not exceeding 3.0, on said first insulating film;
    forming a third insulating film as a cap film on said second insulating film;
    forming a first resist film having a predetermined pattern on said third insulating film;
    dry etching said third insulating film and said second insulating film, using said first resist film as a mask, to form an opening extending to said first insulating film;
    removing said first resist film by ashing using at least one of hydrogen and an inert gas;
    dry etching said first insulating film, using said third insulating film as a mask, to form a wiring trench extending to said lower-layer wiring;
    forming a copper layer filling said wiring trench; and
    planarizing by chemical mechanical polishing (CMP), leaving said copper layer only in said wiring trench, to form a trench wiring electrically connected to said lower wiring, wherein dry etching of said third and second insulating films and dry etching of said first insulating film use a fluorine-containing gas at a pressure of 0.1 Pa to 4 Pa.

2. The method for manufacturing a semiconductor device according to claim 1, including dry etching of said third and second insulating films using a fluorine-containing gas at a pressure of 0.8 Pa to 3.3 Pa.

3. The method for manufacturing a semiconductor device according to claim 1, wherein said second insulating film is composed of a material including siloxane bonds having methyl groups as chain-forming bonds.

4. The method for manufacturing a semiconductor device according to claim 1, wherein said second insulating film is one of a methyl silsesquioxane (MSQ) film and a porous MSQ film.

5. The method for manufacturing a semiconductor device according to claim 1, further comprising:
    forming a fourth insulating film on said trench wiring;
    forming a fifth insulating film having a large etching selection ratio relative to said fourth insulating film, and having a relative dielectric constant not exceeding 3.0, on said fourth insulating film;
    forming a sixth insulating film as a cap film on said fifth insulating film;
    forming a second resist film having a predetermined pattern on said sixth insulating film;
    dry etching said sixth insulating film and said fifth insulating film, using said second resist film as a mask, to form an opening extending to said fourth insulating film;
    removing said second resist film by ashing;
    dry etching said fourth insulating film, using said sixth insulating film as a mask, to form a via hole extending to said trench wiring;
    forming a copper layer filing said via hole; and
    planarizing by CMP, leaving said copper layer only in said via hole, to form a via plug electrically connected to said trench wiring, wherein dry etching of said sixth insulating film uses a gas containing fluorine at a pressure of 0.1 Pa to 4 Pa.

6. The method for manufacturing a semiconductor device according to claim 5, including dry etching of said third and second insulating films using a fluorine-containing gas at a pressure of 0.8 Pa to 3.3 Pa.

7. The method for manufacturing a semiconductor device according to claim 5, including ashing of said second resist film using at least one of hydrogen and an inert gas.

8. The method for manufacturing a semiconductor device according to claim 5, wherein said fifth insulating film is composed of a material including siloxane bonds having methyl groups as chain-forming bonds.

9. The method for manufacturing a semiconductor device according to claim 5, wherein said fifth insulating film is one of a methyl silsesquioxane (MSQ) film and a porous MSQ film.

10. The method for manufacturing a semiconductor device according to claim 1, wherein said fluorine-containing gas is $CF_4$.

11. A method for manufacturing a semiconductor device having a multi-layer wiring structure, comprising:
- forming a first insulating film on a lower-layer wiring on a semiconductor substrate;
- forming a second insulating film having a large etching selection ratio relative to said first insulating film, and having a relative dielectric constant not exceeding 3.0, on said first insulating film;
- forming a third insulating film as a cap film on said second insulating film;
- forming a first antireflective film on said third insulating film;
- forming a first resist film having a predetermined pattern on said first antireflective film;
- dry etching said first antireflective film, said third insulating film, and said second insulating film, using said first resist film as a mask, to form an opening extending said first insulating film;
- removing said first resist film and said first antireflective film by ashing;
- dry etching said first insulating film, using said third insulating film as a mask, to form a wiring trench extending to said lower-layer wiring;
- forming a copper layer filling said wiring wench; and
- planarizing by chemical mechanical polishing (CMP), leaving said copper layer only in said wiring trench, to form a wench wiring electrically connected to said lower-layer wiring, wherein dry etching of said first antireflective film and said third and second insulating films uses a gas containing fluorine at a pressure of 0.1 Pa to 4 Pa.

12. The method for manufacturing a semiconductor device according to claim 11, including dry etching of said first antireflective film and said third and second insulating films uses a fluorine-containing gas at a pressure of 0.8 Pa to 3.3 Pa.

13. The method for manufacturing a semiconductor device according to claim 11, including ashing of said first resist film and said first antireflective film using at least one of hydrogen and an inert gas.

14. The method for manufacturing a semiconductor device according to claim 11, wherein said second insulating film is composed of a material including siloxane bonds having methyl groups as chain-forming bonds.

15. The method for manufacturing a semiconductor device according to claim 11, wherein said second insulating film is one of a methyl silsesquioxane (MSQ) film and a porous MSQ film.

16. The method for manufacturing a semiconductor device according to claim 11, further comprising:
- forming a fourth insulating film on said trench wiring;
- forming a fifth insulating film having a large etching selection ratio relative to said fourth insulating film, and having a relative dielectric constant not exceeding 3.0, on said fourth insulating film;
- forming a sixth insulating film as a cap film on said fifth insulating film;
- forming a second antireflective film on said sixth insulating film;
- forming a second resist film having a predetermined pattern on said second antireflective film;
- dry etching said second antireflective film, said sixth insulating film, and said fifth insulating film using said second resist film as a mask, to form an opening extending to said fourth insulating film;
- removing said second resist film and said second antireflective film by ashing;
- dry etching said fourth insulating film, using said sixth insulating film as a mask, to form a via hole extending to said trench wiring;
- forming a copper layer filling said via hole; and
- planarizing by CMP, leaving said copper layer only in said via hole, to form a via plug electrically connected to said trench wiring, including dry etching said second antireflective film and said sixth, and fifth insulating films using a gas containing fluorine at a pressure of 0.1 Pa to 4 Pa.

17. The method for manufacturing a semiconductor device according to claim 16, including dry etching of said first antireflective film and said third and second insulating film using a fluorine-containing gas at a pressure of 0.8 Pa to 3.3 Pa.

18. The method for manufacturing a semiconductor device according to claim 16, including ashing said second resist film and said second antireflective film using at least one of hydrogen and an inert gas.

19. The method for manufacturing a semiconductor device according to claim 16, wherein said fifth insulating film is composed of a material including siloxane bonds having methyl groups as chain-forming bonds.

20. The method for manufacturing a semiconductor device according to claim 16, wherein said fifth insulating film is one of a methyl silsesquioxane (MSQ) film and a porous MSQ film.

* * * * *